United States Patent [19]

Tomioka et al.

[11] Patent Number: 5,034,704
[45] Date of Patent: Jul. 23, 1991

[54] HIGH FREQUENCY OSCILLATION TYPE PROXIMITY SWITCH

[75] Inventors: Hidehiro Tomioka, Ayabe; Masakatsu Hosoya, Kameoka; Kenji Ueda, Otsu, all of Japan

[73] Assignee: OMRON Corporation, Kyoto, Japan

[21] Appl. No.: 529,357

[22] Filed: May 29, 1990

[30] Foreign Application Priority Data

May 26, 1989 [JP] Japan .................................. 1-134234

[51] Int. Cl.⁵ ............................................ G01R 33/00
[52] U.S. Cl. .................................... 331/65; 324/236; 324/327
[58] Field of Search ............. 331/65, 117 R; 324/236, 324/327

[56] References Cited

U.S. PATENT DOCUMENTS 3,896,371 7/1975 Hametta ............................ 331/65 X Primary Examiner—Robert J. Pascal
Attorney, Agent, or Firm—Dickstein, Shapiro & Morin

[57] ABSTRACT

A high frequency oscillation type proximity switch, comprising: an oscillation circuit having a first resonant frequency; a tank circuit connected in a positive feedback path of the oscillation circuit and including an LC resonant circuit having a second resonant frequency slightly different from the first resonant frequency; and a comparator circuit which discriminates the amplitude of an oscillation output of the oscillating circuit at a predetermined threshold level; the comparator producing a detection output signal when a nonmagnetic metallic object is brought to a certain proximity of a coil included in the LC resonant circuit and a level of the oscillation has thereby changed by a certain amount as a result of a change in the susceptance of the coil. Since the approach of a magnetic object increases the loss of the coil whereas the approach of a nonmagnetic metallic object increases the susceptance of the coil, it is possible to detect magnetic objects alone, nonmagnetic metallic objects alone, or both magnetic objects and nonmagnetic metallic objects alike by appropriately selecting the resonant frequencies of the oscillation circuit, and the tank circuit and the threshold level of the comparator circuit.

8 Claims, 5 Drawing Sheets

HIGH FREQUENCY OSCILLATION TYPE PROXIMITY SWITCH

TECHNICAL FIELD

The present invention relates to a high frequency type proximity switch, and in particular to a high frequency oscillation type proximity switch which can detect nonmagnetic metallic bodies alone, magnetic objects alone, or both nonmagnetic metallic bodies and magnetic objects as desired.

BACKGROUND OF THE INVENTION

Generally, in a high frequency oscillation type proximity switch, as shown in FIG. 8 illustrating a related art proximity switch, a parallel resonant circuit 1 is formed by a detection coil L and a capacitor C. An oscillation circuit 2 is connected to this parallel resonant circuit to supply a high frequency resonance signal thereto, and this oscillation signal is detected by a detector circuit 3. When a metallic body 4 comes to a certain proximity of the detection coil L, the loss of the detection coil L increases and its oscillation condition changes thereby reducing the amplitude of the oscillation output signal. Therefore, the output of the detector circuit 3 is supplied to a comparator circuit 5 which discriminates the output and supplies a detection signal to an external circuit via an output circuit 6. Thus, approach of an object can be detected from the drop in the amplitude of the oscillation circuit 2.

According to such a high frequency oscillation type proximity switch, the electromagnetic loss of the detection coil increases by the approach of a metallic object, in particular by the approach of a magnetic object such as iron and steel members, but is relatively insensitive to nonmagnetic objects, and the presence of nonmagnetic members such as aluminum objects may not be detected. In recent years, as a result of the effort to reduce the weight of various pieces of equipment, more and more aluminum members are being used as work pieces to be handled in manufacturing plants, and there is a growing need to be able to detect such objects.

Normally, an approach of an iron object to a detection coil causes an increase in the loss of the detection coil, but an approach of an aluminum object to a detection coil causes an increase in the susceptance of the detection coil. On the other hand, the increase in the loss of the coil due to the approach of an aluminum object is so small and the resulting change in the oscillation amplitude is so small that the detection sensitivity has been considered to be too low for most practical purposes.

BRIEF SUMMARY OF THE INVENTION

In view of such problems of the prior art, a primary object of the present invention is to provide a high frequency oscillation type proximity switch which can detect both magnetic objects such as iron members and nonmagnetic objects such as aluminum members.

A second object of the present invention is to provide a high frequency oscillation type proximity switch which can detect nonmagnetic metallic objects such as aluminum members but is insensitive to magnetic objects.

A third object of the present invention is to provide a high frequency oscillation type proximity switch which can detect magnetic objects such as iron members but is insensitive to nonmagnetic metallic objects.

These and other objects of the present invention can be accomplished by providing a high frequency oscillation type proximity switch, comprising: an oscillation circuit, of an LC, crystal oscillator or other type, having a first resonant frequency; a tank circuit connected in a positive feedback path of the oscillation circuit and including an LC resonant circuit having a second resonant frequency slightly different from the first resonant frequency; and a comparator circuit which discriminates the amplitude of an oscillation output of the oscillating circuit at a predetermined threshold level; the comparator producing a detection output signal when a nonmagnetic metallic object is brought to a certain proximity of a coil included in the LC resonant circuit and a level of the oscillation output has thereby changed by a certain amount as a result of a change in the susceptance of the coil.

Since the approach of a magnetic object increases the loss of the coil whereas the approach of a nonmagnetic metallic object increases the susceptance of the coil, it is possible to detect magnetic objects alone, nonmagnetic metallic objects alone, or both magnetic objects and nonmagnetic metallic objects alike by appropriately selecting the resonant frequencies of the oscillation circuit and the tank circuit, and the threshold level of the comparator circuit.

According to a preferred embodiment of the present invention, the first resonant frequency is lower than the second resonant frequency, and the resonant frequencies are so determined that the amplitude of the oscillation output of the oscillation circuit drops a same amount when a magnetic body has come to a certain proximity as when a nonmagnetic metallic body has come to a same proximity. Thereby, it is possible to detect both magnetic objects and nonmagnetic metallic objects at equal sensitivity.

According to another embodiment of the present invention, the first resonant frequency is lower than the second resonant frequency, and the resonant frequencies are so determined that the amplitude of the oscillation output of the oscillation circuit drops by a substantially larger amount when a nonmagnetic metallic body has come to a certain proximity than when a magnetic object has come to a same proximity. Thereby, it is possible to detect nonmagnetic metallic objects alone, and to be relatively insensitive to magnetic objects.

According to yet another embodiment of the present invention, the first resonant frequency is higher than the second resonant frequency, and the resonant frequencies are so determined that the amplitude of the oscillation output of the oscillation circuit drops when a magnetic object has come to a certain proximity but increases when a nonmagnetic metallic object has come to a certain proximity. Thereby, it is possible to detect either nonmagnetic metallic objects alone or magnetic objects alone as desired.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
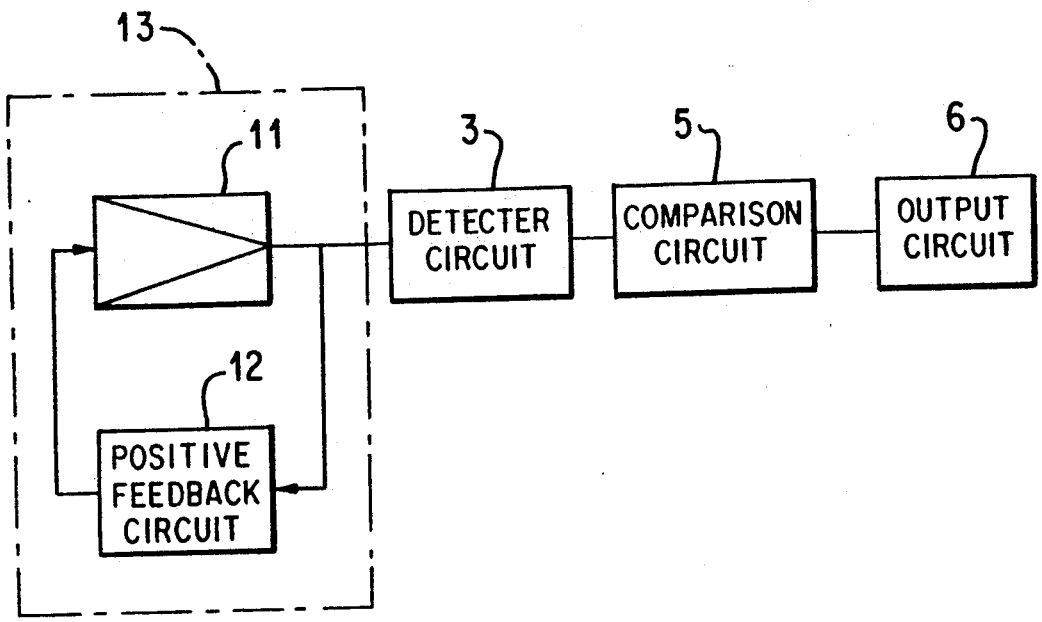
FIG. 1 is a block diagram of the basic structure of the proximity switch according to the present invention.

FIG. 1 is a block diagram showing the basic structure of the proximity switch according to the present invention. Referring to FIG. 1, an oscillation circuit 13 is formed by connecting a positive feedback circuit 12 to an amplification circuit 13. The output of the oscillation circuit 13 is supplied to a detector circuit 3 in the same way as the aforementioned related art. The detector circuit 13 detects this output and converts it into a DC level signal corresponding to its amplitude to supply it to a comparison circuit 5. The comparison circuit 5 discriminates the output according to a certain threshold level, and supplies a detection signal to an external circuit from its output circuit 6 in the same way as in the aforementioned related art. Now, according to the present invention, a positive feedback circuit 12 is connected to a tank circuit having a resonant frequency which is different from the oscillation frequency.

Figure 2:
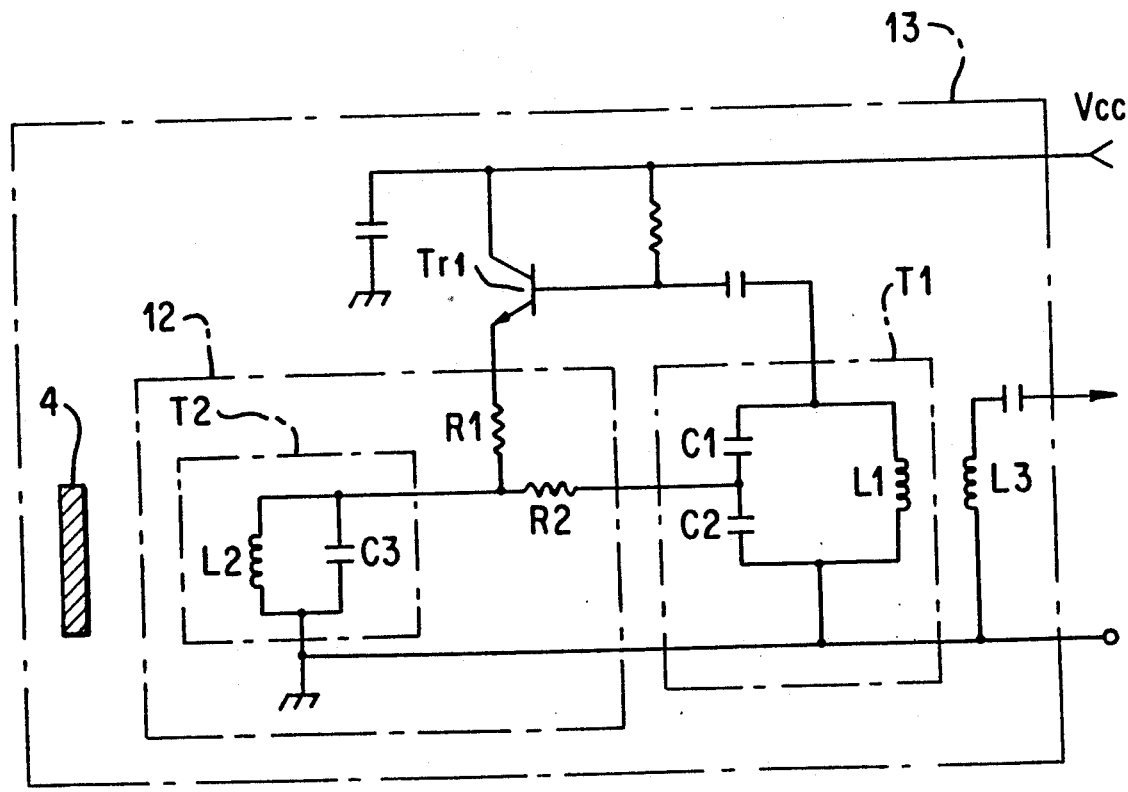
FIG. 2 is a circuit diagram showing a first embodiment of the oscillation circuit.

FIG. 2 is a circuit diagram showing the oscillation circuit 13 according to a first embodiment of the present invention. This oscillation circuit 13 consists of an LC type oscillation circuit including a tank circuit consisting of a coil L1 and capacitors C1 and C2, and having a resonant frequency of f1. The hot end of the coil L1 of the tank circuit T1 is connected to the base of a transistor Tr1. The transistor Tr1 has its collector connected to a power source end, and its emitter connected in the positive feedback circuit 12. In the present embodiment, the positive feedback circuit 12 comprises resistors R1 and R2 which are connected in series, and a second tank circuit T2 is connected between the node of the two resistors and ground. The second tank circuit T2 consists of a detection coil L2 and a capacitor C3, and has a resonant frequency f2 which is slightly higher than the resonant frequency f1 of the first tank circuit T1. The coil L2 is placed on a front end of the proximity switch so that the loss and the susceptance of the coil may be affected by an approaching object. The coil L1 is coupled to a secondary coil L3 to supply an oscillation output therefrom to the detector circuit 3.

Figure 3:
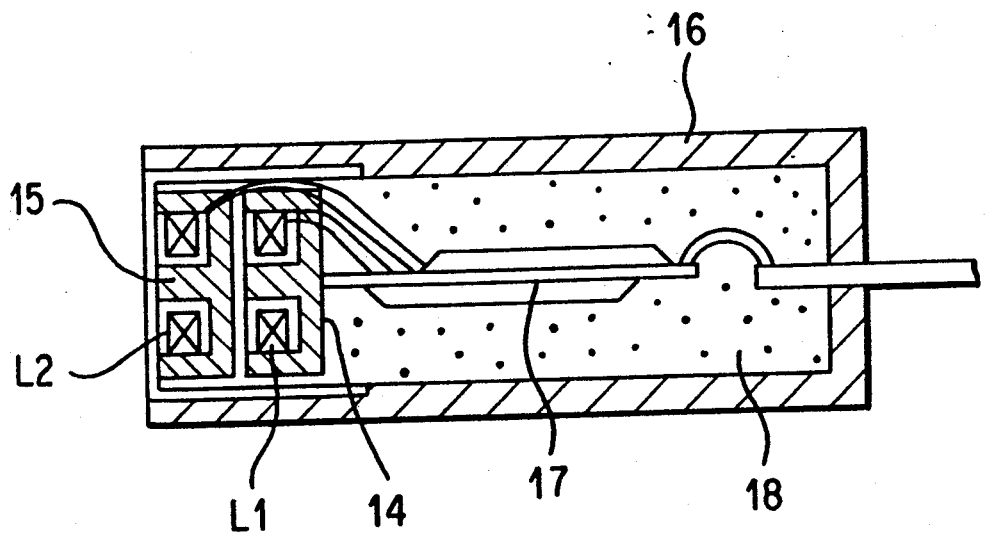
FIG. 3 is a sectional view showing the structure of the proximity switch.

FIG. 3 is a sectional view showing the structure of the proximity switch in which the coils L1 and L2 of the two tank circuits T1 and T2, respectively, are placed under a same thermal environment. As shown in this drawing, the coils L1 and L2 of the tank circuits T1 and T2, respectively, are placed in pot cores 14 and 15, respectively, each having an annular recess for receiving a coil winding therein, and the detection coil L2 is placed on the front end of the proximity switch. Thus, since the two coils L1 and L2 are placed in tandem close to each other, the coil L1 is protected from external magnetic influences but the coil L2 is exposed to external magnetic influences and is therefore suitable for detecting an object. The case 16 accommodates, therein a printed circuit board 17 carrying the oscillation circuit 13, the detector circuit 3, the comparison circuit 5 and so on. The clearance in the interior of the case 16 of this proximity switch is filled with filling material such as epoxy resin 18. By thus placing the two coils in a thermally uniform environment, the proximity sWitch may be operated in a stable fashion against temperature drifts.

Figure 4:
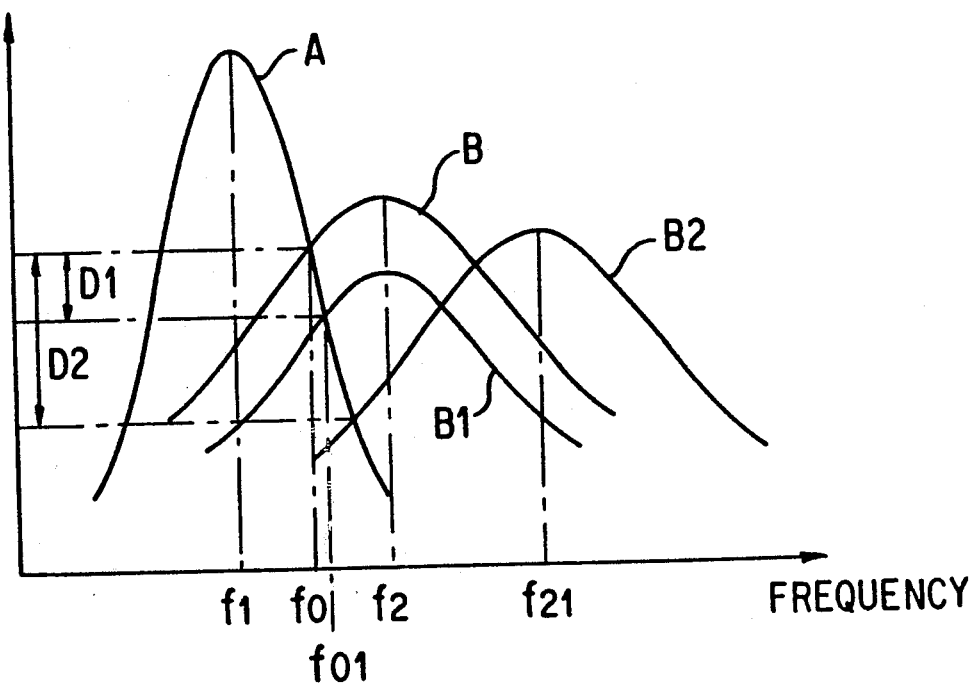
FIG. 4 is a diagram showing the changes in the amplitude level of the tank circuit with respect to frequency.

Now the operation of this embodiment is described in the following. Referring to FIG. 4, the curves A and B denote the changes in the amplitude levels of the two tank circuits T1 and T2 with respect to frequency. As shown in this drawing, the resonant frequency of the tank circuit T1 is set at a relatively low frequency f1 while the resonant frequency of the tank circuit T2 is set at a relatively high frequency f2. The oscillation circuit 13 oscillates at the frequency which maximizes the overall gain of the circuit, or, in other words, at which the amplitude levels of the two tank circuit cross each other. Now, in this drawing, the loss of the detection coil L2 of the second tank circuit T2 increases as an iron object comes close to the detection coil L2, and its amplitude level changes as indicated by the curve B1. Therefore, since the oscillation frequency of slightly rises to f01 and the amount of positive feedback accordingly diminishes, the amplitude of the oscillation circuit 13 also diminishes. This reduction in the amplitude is indicated by the difference D1 between the crossing points between the curves A and B and the curves A and B1 as shown in FIG. 4. When an aluminum object comes close to the detection coil L2 of the second tank coil T2, its amplitude property changes in such a manner that the oscillation frequency f2 rises to f21 as indicated by the shift from the curve B to the curve B2. Therefore, at the same time as the slight rise in the oscillation frequency f0, the amplitude decreases due to the change in the oscillation frequency f2. This change in the amplitude is represented by the difference D2 between the crossing points between the curves A and B and the curves A and B2. Therefore, by so arranging that the changes in the feedback level D1 and D2 become identical to each other when an iron object and an aluminum object have come to a certain proximity, it is possible to achieve a same sensitivity to both iron and aluminum.

Alternatively, by setting the difference D2 to be substantially larger than the difference D1, it is possible to detect nonmagnetic metallic objects alone without being affected by magnetic objects by appropriately setting the threshold level of the comparator circuit 5.

Figure 5:
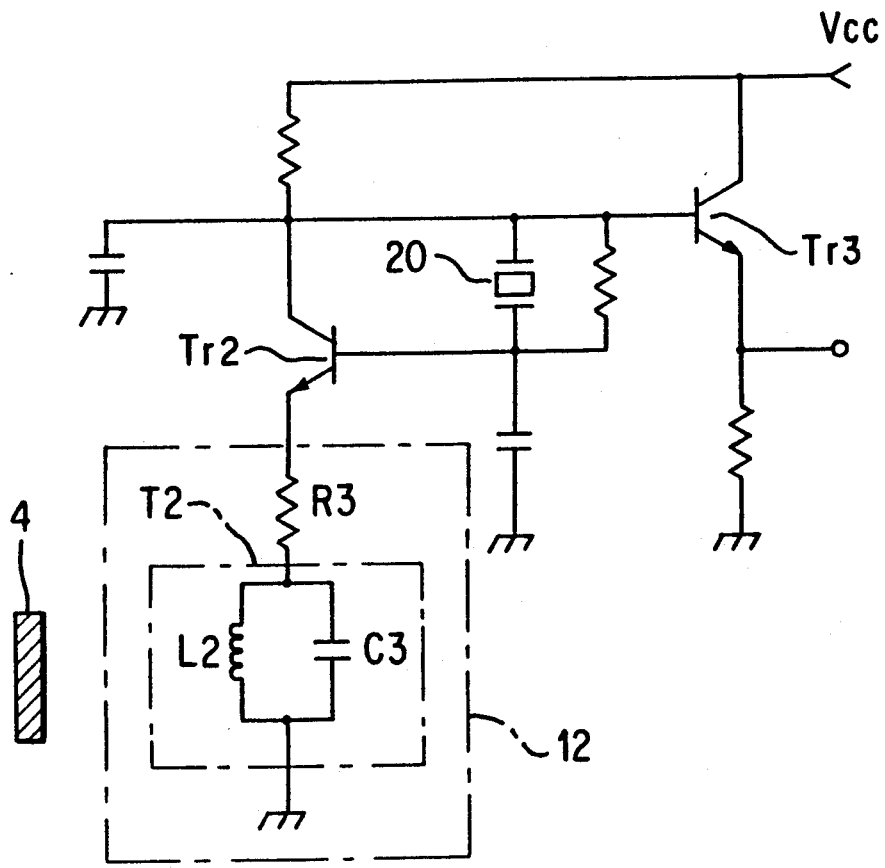
FIG. 5 is a circuit diagram of the oscillation circuit according to a second embodiment of the present invention.

In the above described embodiment, the second tank coil circuit T2 was connected to the positive feedback loop of the oscillation circuit using an LC resonant circuit and its coil was used as the detection coil, but it is also possible to provide the second tank circuit T2 in the positive feedback loop of a crystal oscillation circuit, and to use its coil as a detection coil. In FIG. 5, a crystal oscillator 20 is connected between the base and collector of a transistor Tr2, and the output from its collector is supplied to an external circuit via an emitter follower transist Tr3. A positive feedback circuit 12 having a second tank circuit T2 is connected between the emitter of the transistor Tr2 and ground. In this case, the impedance of the tank circuit T2 as seen from the base of the transistor Tr2 changes according to the approach of an object. In this case, since the oscillation frequency is substantially fixed owing to the use of the crystal oscillator, and the amplitude of the oscillation circuit changes according to the changes in the resonant frequency of the positive feedback tank circuit and its property in regard to the object.

Figure 6:
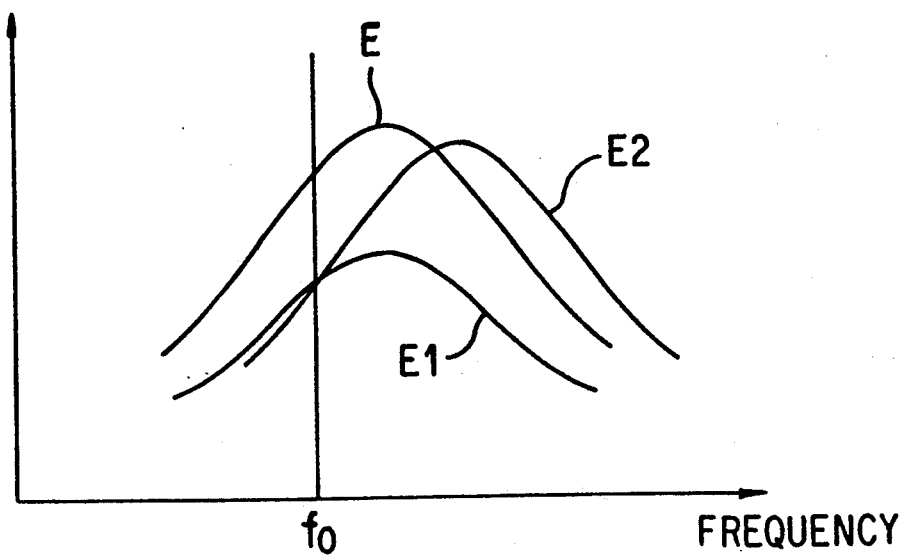
FIG. 6 is a diagram showing an amplitude property thereof.

Now, as shown in FIG. 6, the amplitude property of the tank circuit T2 when there is no object in proximity is represented by the curve E, and the amplitude property when there are an iron object and an aluminum object have come to a certain distance are expressed by the curves E1 and E2, respectively. It is possible to achieve a uniform sensitivity by arranging the tank circuit in such a manner that the amounts of reduction in the amplitude may become identical when either an iron object or an aluminum object is brought to a certain proximity.

Figure 7A:
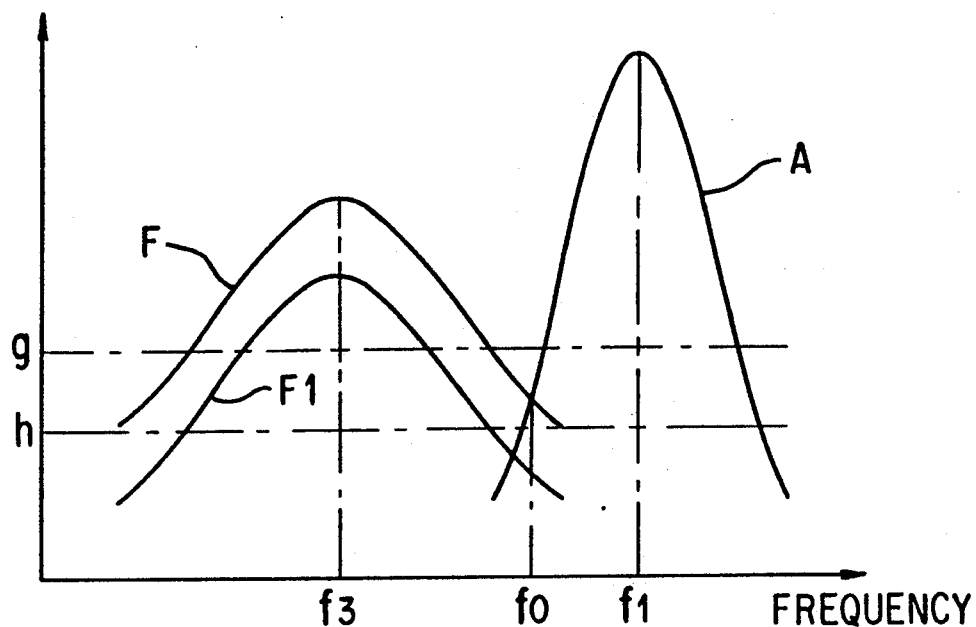
FIGS. 7(a) and 7(b) are graphs showing the amplitude properties with respect to frequency in yet another embodiment of the proximity switch.
Figure 7B:
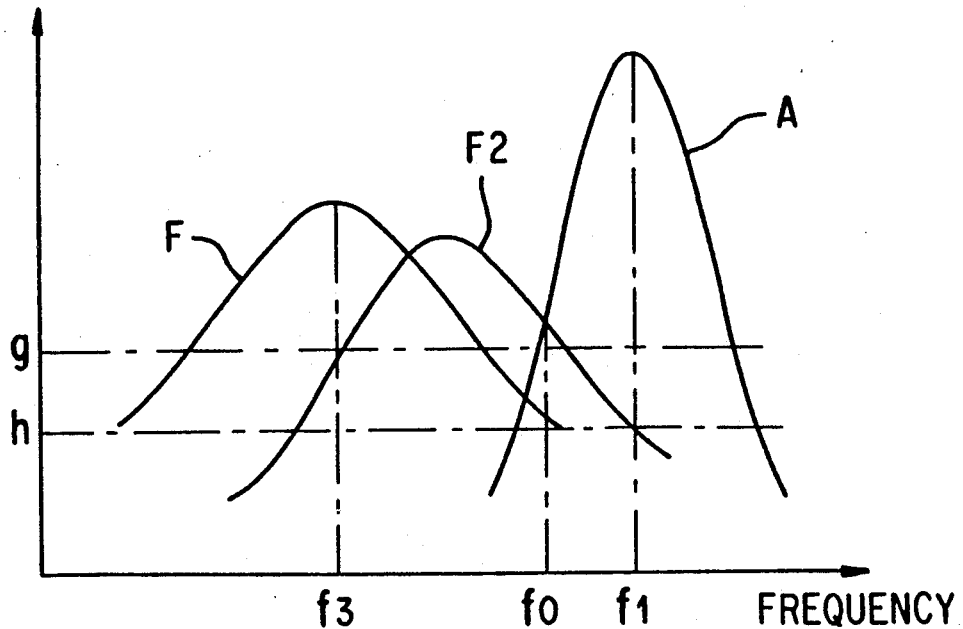
Figure 8:
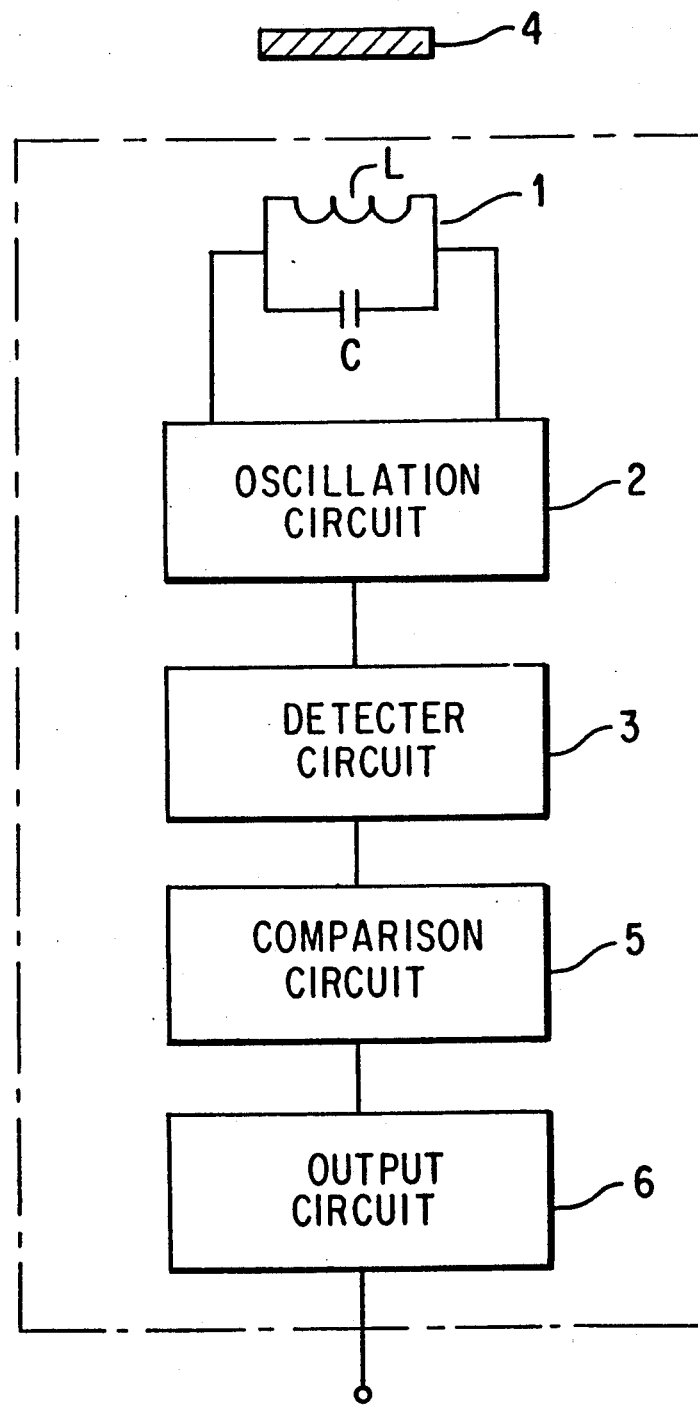
FIG. 8 is a block diagram of an example of related art proximity switch.

Now yet another embodiment of the present invention is described in the following. In this embodiment, the circuit structure is identical to that of the first embodiment illustrated in the block diagram shown in FIG. 1 and the circuit diagram shown in FIG. 2. In this embodiment, however, the resonant frequency f3 of the second tank circuit T2 is set so as to be lower than the resonant frequency f1 of the first tank circuit T1 so that no oscillation takes place under normal condition and only aluminum objects may be detected. FIGS. 7(a) and 7(b) show the amplitude curves F1 and F2 representing the approach of an iron object and an aluminum object, respectively, as well as the amplitude curve F representing the state in which no object is in proximity. As shown in FIG. 7(b), if no oscillation is started near the frequency f0 at which the curves A and F cross each other, since the approach of an aluminum object will cause the oscillation starting level g to be exceeded, an oscillation is started at the resonant frequency f0 given as the intersection between the curves F2 and A as shown in the drawing. However, if an iron object approaches, since the amplitude level drops even further as indicated by the curve F1 in FIG. 7(b), the oscillation starting level g is not exceeded, and no oscillation is started. Therefore, only when an aluminum object approaches, oscillation is started, and it becomes possible to detect a nonmagnetic object such as an aluminum member without being affected by magnetic objects.

Also, it is possible to keep the oscillation circuit oscillating at all time, and set the level g shown in FIGS. 7(a) and 7(b) as a normal threshold level so that a nonmagnetic metallic object may be detected from crossing of this level.

Now yet another embodiment of the present invention is described in the following. In this embodiment also, the circuit structure is identical to that of the first embodiment illustrated in the block diagram shown in FIG. 1 and the circuit diagram shown in FIG. 2, and the resonant frequency of the second tank circuit T2 is selected to be lower than the resonant frequency f3 of the first tank circuit T1 in the same way as in the previous embodiment. The threshold level of the comparator circuit is set at the level h in the graphs of FIGS. 7(a) and 7(b). Thereby, the amplitude diminishes as a magnetic object such as an iron member approaches as shown in FIG. 7(a) whereas the approach of a nonmagnetic metallic object such as an aluminum member causes an increase in the amplitude as shown in FIG. 7(b) so that it becomes possible to detect magnetic objects alone without being affected by nonmagnetic metallic objects.

Although the present invention has been described in terms of specific embodiments, it is possible to modify and alter details thereof without departing from the spirit of the present invention.

What we claim is:

1. A high frequency oscillation type proximity switch, comprising:
   an oscillation circuit having a first resonant frequency;
   a tank circuit connected in a positive feedback path of said oscillation circuit and including an LC resonant circuit having a second resonant frequency slightly different from said first resonant frequency; and
   a comparator circuit which discriminates the amplitude of an oscillation output of said oscillating circuit at a predetermined threshold level;
   said comparator producing a detection output signal when a nonmagnetic metallic object is brought to a certain proximity of a coil included in said LC resonant circuit and a level of said oscillation output has thereby changed by a certain amount as a result of a change in the susceptance of said coil.

2. A high frequency oscillation type proximity switch according to claim 1, wherein said oscillation circuit comprises an LC resonant circuit.

3. A high frequency oscillation type proximity switch according to claim 2, wherein said coil of said LC resonant circuit of said tank circuit and a coil of said LC resonant circuit of said oscillation circuit are each formed by a cylindrical pot core having an annular recess receiving a coil winding therein in one of its end surfaces, and said pot cores are placed in tandem to each other with the annular recess of said pot core of said LC resonant circuit of said oscillation circuit being placed next to a bottom surface of said pot core of said LC resonant circuit of said tank circuit.

4. A high frequency oscillation type proximity switch according to claim 1, wherein said oscillation circuit comprises a crystal oscillator.

5. A high frequency oscillation type proximity switch according to claim 1, wherein said first resonant frequency is lower than said second resonant frequency, and said resonant frequencies are so determined that the amplitude of said oscillation output of said oscillation circuit drops a same amount when a magnetic object has come to a certain proximity as when a nonmagnetic metallic object has come to a same proximity.

6. A high frequency oscillation type proximity switch according to claim 1, wherein said first resonant frequency is lower than said second resonant frequency and said resonant frequencies, and said threshold level of said comparator are so determined that a distinct output is produced from said comparator circuit when a nonmagnetic metallic object has come to a certain proximity of said coil.

7. A high frequency oscillation type proximity switch, comprising:
   an oscillation circuit having a first resonant frequency;
   a tank circuit connected in a positive feedback path of said oscillation circuit and including an LC resonant circuit having a second resonant frequency slightly different from said first resonant frequency; and
   a comparator circuit which discriminates the amplitude of an oscillation output of said oscillating circuit at a predetermined threshold level;
   said comparator producing a detection output signal when a magnetic object is brought to a certain proximity of a coil included in said LC resonant circuit, and a level of said oscillation has thereby changed by a certain amount as a result of a change in an electromagnetic loss of said coil.

8. A high frequency oscillation type proximity switch, comprising:

an oscillation circuit having a first resonant frequency;

a tank circuit connected in a positive feedback path of said oscillation circuit and including an LC resonant circuit having a second resonant frequency slightly different from said first resonant frequency; and a comparator circuit which discriminates the amplitude of an oscillation output of said oscillating circuit at a predetermined threshold level;

said comparator producing a detection output signal when a nonmagnetic metallic object is brought to a certain proximity of a coil included in said LC resonant circuit, and a level of said oscillation has thereby changed by a certain amount as a result of a change in an electromagnetic loss of said coil.

* * * * *